(12) United States Patent
Sohn et al.

(10) Patent No.: US 8,189,403 B2
(45) Date of Patent: May 29, 2012

(54) HIGH SPEED LINEAR DIFFERENTIAL AMPLIFIER

(75) Inventors: Young-Soo Sohn, Seoul (KR);
Jeong-Don Lim, Seongnam-si (KR);
Kwang-Il Park, Yongin-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 68 days.

(21) Appl. No.: 12/817,760

(22) Filed: Jun. 17, 2010

(65) Prior Publication Data

US 2011/0001562 A1 Jan. 6, 2011

(30) Foreign Application Priority Data

Jul. 6, 2009 (KR) .................. 10-2009-0061166

(51) Int. Cl.
*G11C 7/00* (2006.01)
*H03L 7/00* (2006.01)
(52) U.S. Cl. .............. 365/189.07; 365/189.09; 365/207; 365/208; 331/34; 331/57; 331/175; 331/177 R; 331/185
(58) Field of Classification Search .............. 331/57, 331/34, 175, 177 R, 185; 330/252, 253, 330/254, 259, 261; 365/189.07, 189.09, 365/207, 208
See application file for complete search history.

(56) References Cited

U.S. PATENT DOCUMENTS

| | | | |
|---|---|---|---|
| 5,412,349 A | 5/1995 | Young et al. | |
| 5,699,014 A | 12/1997 | Haefner et al. | |
| 5,847,616 A | 12/1998 | Ng et al. | |
| 6,252,467 B1 * | 6/2001 | Yoshimura | 331/175 |
| 6,529,077 B1 * | 3/2003 | Dasgupta | 330/254 |
| 6,952,133 B2 * | 10/2005 | Groe | 330/259 |
| 7,057,460 B2 * | 6/2006 | Kaviani et al. | 330/261 |
| 7,157,971 B2 * | 1/2007 | Groe | 330/259 |
| 7,675,363 B2 * | 3/2010 | Deguchi et al. | 330/254 |

FOREIGN PATENT DOCUMENTS

JP 2004-247805 9/2004

OTHER PUBLICATIONS

Ang et al., Patent Application Publication US 2007/0284609 A1 U.S. Appl. No. 11/423,649).*

* cited by examiner

*Primary Examiner* — Trong Phan
(74) *Attorney, Agent, or Firm* — F. Chau & Associates, LLC (57) ABSTRACT

A high speed linear differential amplifier (HSLDA) having automatic gain adjustment to maximize linearity regardless of manufacturing process, changes in temperature, or swing width change of the input signal. The HSLDA comprises a differential amplifier, and a control signal generator including a replica differential amplifier, a reference voltage generator, and a comparator. The comparator outputs a control signal that automatically adjusts the gain of the high speed linear differential amplifier and of the replica differential amplifier. The replica differential amplifier receives predetermined complementary voltages as input signals and outputs a replica output signal to the comparator. The reference voltage generator outputs a voltage to the comparator at which linearity of the output signal of the differential amplifier is maximized. The control signal equalizes the voltage level of the replica output signal and the reference voltage, and controls the gain of the differential amplifier.

13 Claims, 4 Drawing Sheets

HIGH SPEED LINEAR DIFFERENTIAL AMPLIFIER

PRIORITY STATEMENT

This application claims the benefit of priority, under 35 U.S.C. §119, of Korean Patent Application No. 10-2009-0061166, filed on Jul. 6, 2009, which is hereby incorporated by reference herein in its entirety.

BACKGROUND

1. Field of the Inventive Concept

Exemplary embodiments of the inventive concept relate to a high speed linear differential amplifier, and more particularly, to a high speed linear differential amplifier having a gain adjusted by an applied control voltage.

2. Description of Related Art

A differential amplifier is a circuit that detects and amplifies a voltage difference between input signals input to two input terminals and that outputs an amplified voltage. The ratio of a change in voltage difference between output signals to a change in voltage difference between input signals is called the "gain" of the differential amplifier. Differential amplifiers with a large gain widely used, but a differential amplifier with a characteristic of being capable of securing a wide range in which an output signal linearly changes with respect to a change of a voltage difference between input signals rather than the gain is also required according to necessity.

Figure 1:
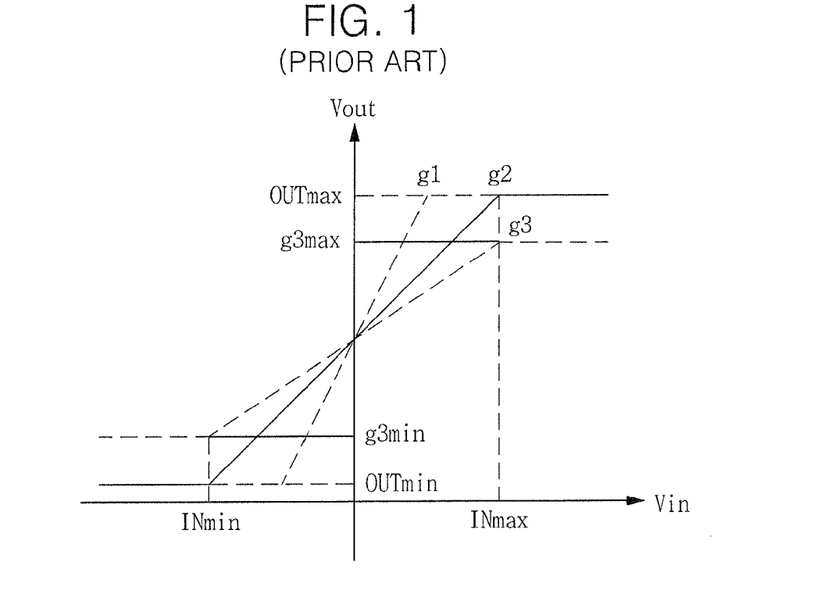
FIG. 1 is a graph illustrating the range of the gain (the ratio of the change of an output voltage with respect to a change in input voltage) of a conventional differential amplifier.

FIG. 1 is a graph illustrating the range of the gain (the ratio of the change of an output voltage with respect to a change in input voltage) of a differential amplifier. Hereinafter, it is assumed that two input signals are a pair of differential input signals which are inverted relative to each other. As illustrated in FIG. 1, when the gain of the differential amplifier is large (g1), the change of an output voltage Vout with respect to a change of an input voltage Vin is large, but range the voltage range within which the output voltage Vout changes linearly with respect to a change in the input voltage Vin is small. This is because a possible voltage level of the output voltage Vout of the differential amplifier is bounded by a maximum output voltage OUTmax and a minimum output voltage OUTmin. On the other hand, when the gain g3 of the differential amplifier is smaller, the change of the output voltage Vout with respect to the change of the input voltage Vin is small, but the range in which the output voltage Vout linearly changes with respect to a change in the input voltage Vin is larger. Therefore, the output voltage Vout linearly changes as the voltage level of the input signal changes in a wide range. However, since the voltage level of the input voltage Vin also has minimum and maximum voltage values, when the gain g3 of the differential amplifier is small, the swing width of the output voltage Vout to the change of the input voltage does not reach the maximum output voltage OUTmax and the minimum output voltage OUTmin. Thus, as illustrated in FIG. 1, when the gain g3 of the differential amplifier is too small, the output voltage Vout stays in a voltage range between the maximum gain output voltage g3max and the minimum gain output voltage g3min because the input is not amplified up to the maximum output voltage OUTmax and the minimum output voltage OUTmin for maximum and minimum input voltages INmax and INmin, respectively. Therefore, the swing width of the output voltage Vout of the differential amplifier is reduced when the gain g3 of the differential amplifier is too small.

When the differential amplifier has a gain g2 between the gain g1 and the gain g3, the output voltage Vout has a maximum swing width while linearly changing with respect to the change of the input voltage Vin of the differential amplifier. Therefore, it is important that the differential amplifier can linearly change the output voltage Vout in a range between the minimum and maximum voltages of the input signal and has the gain g2 which provides the maximum output voltage swing width.

The linear differential amplifier in which the output signal linearly changes can be used for impedance conversion, various operations, equalizers, pre-amplification of a multi-level signal, and common mode removal of the input signal since the output signal linearly changes in the entire swing width range of the input signal. Thus, since the linear differential amplifier outputs the output signal that maintains the waveform of the input signal, the linear differential amplifier is used in circuits that detect an input signal at multiple levels (i.e., not only a high and low level).

A linear differential amplifier is frequently used as an input/output circuit in circuits that detect the input signal at multiple levels, and can function as a high speed input/output circuit since the linear differential amplifier linearly amplifies changes of the input signal in the whole range of the output signal as described above.

In order to configure the gain of a linear differential amplifier, a transistor or a resistor is typically adjusted. However, such amplitude (gain) adjustment circuit elements may cause the gain of the differential amplifier to vary undesirably due to a changes in process, temperature, and swing width of the input signal. When the gain changes, the output signal of the differential amplifier may not linearly change over an entire swing width range of the input signal.

SUMMARY OF THE INVENTION

Exemplary embodiments of the inventive concept provide a high speed linear differential amplifier that can output an output signal that linearly changes over an entire swing width range of an input signal regardless of, for example, a manufacturing process or change of temperature. The amplifier employs source degeneration elements to extend the linear range.

Exemplary embodiments of the inventive concept provide a high speed differential amplifier including: a differential amplifier having adjustable gain controlled in response to a control signal and configured amplify the voltage difference between an input signal and an inverted input signal and to generate an output signal; and a control signal generator configured to generate the control signal, including a replica differential amplifiers configured to generate a replica output signal based on predetermined complementary reference input voltages (within the expected range of the real input signals of the differential amplifier) and the control signal. The control signal generator compares the replica output signal with a reference voltage to generate the control signal, wherein the reference voltage is set to a voltage that maximizes the linearity of the output signal of the differential amplifier with respect to the input signal and the inverted input signal.

In exemplary embodiments of the inventive concept, the differential amplifier may include: a first input unit connected between a first power supply voltage and a common node, and configured to receive the control signal and a first input signal and to output an inverted output signal to a first output node; a second input unit connected between the first power supply voltage and the common node in parallel with the first input unit, and configured to receive the control signal and a second input signal and to output the output signal to a second node; and a driving unit including a driving transistor connected between the common node and a second power supply voltage, and configured to activate the differential amplifier in response to a bias voltage applied to the gate of the driving transistor.

In exemplary embodiments of the inventive concept, the first input unit may include: a first load resistor connected between the first power supply voltage and the first output node; a first input transistor connected to the first output node, and configured to receive the input signal at its gate; and a first control transistor connected between the first input transistor and the common node, and configured to receive the control signal at its gate.

In exemplary embodiments of the inventive concept, the second input unit may include: a second load resistor connected between the first power supply voltage and the second output node; a second input transistor connected to the second output node, and configured to receive the inverted input signal at its gate; and a second control transistor connected between the second input transistor and the common node, and configured to receive the control signal at its gate.

In exemplary embodiments of the inventive concept, the control signal generator may include: a reference voltage generator configured to generate the reference voltage; a replica differential amplifier having the same size and configuration as the differential amplifier, and configured to receive the control signal, the reference input signal, and the inverted reference input signal and to generate the replica output signal; and a comparison unit configured to compare the reference voltage with the replica output signal, and to adjust and output the control signal so that the replica output signal has the same voltage level as the reference voltage.

In exemplary embodiments of the inventive concept, the reference voltage generator may include: a reference resistor connected between the first power supply voltage and a third node; and a bias transistor connected between the third node and the second power supply voltage, and configured to receive the bias voltage at its gate.

In exemplary embodiments of the inventive concept, a channel width of the bias transistor may be designed to correspond to a voltage level of the reference input signal with respect to a maximum voltage level of the input signal.

In exemplary embodiments of the inventive concept, the reference resistor may be a variable resistor.

In exemplary embodiments of the inventive concept, the replica differential amplifier may include: a first replica input unit including a first replica resistor, a first replica input transistor, and a first replica control transistor all of which are serially connected between the first power supply voltage and a replica common node, and configured to receive the reference input signal at the gate of the first replica input transistor and receive the control signal at the gate of the first replica control transistor; a second replica input unit including a second replica resistor, a second replica input transistor, and a second replica control transistor all of which are serially connected in parallel with the first replica input unit between the first power supply voltage and a replica common node, and configured to receive the inverted reference input signal at the gate of the second replica input transistor and receive the control signal at the gate of the second replica control transistor; and a replica driving unit including a replica driving transistor connected between the replica common node and the second power supply voltage, and configured to activate the replica differential amplifier in response to a bias voltage applied to the gate of the replica driving transistor.

In exemplary embodiments of the inventive concept, the comparison unit may include a comparator configured to compare the reference voltage with the replica output voltage applied from a fourth node between the second replica resistor and the second replica input transistor and output the control signal.

Various exemplary embodiments will now be described more fully with reference to the accompanying drawings in which some exemplary embodiments of the inventive concept are shown. Detailed illustrative embodiments are disclosed herein. However, specific structural and functional details disclosed herein are merely representative for purposes of describing exemplary embodiments of the inventive concept. This inventive concept, however, may be embodied in many alternate forms and should not be construed as limited to only exemplary embodiments of the inventive concept set forth herein.

Accordingly, while exemplary embodiments of the inventive concept are capable of various modifications and alternative forms, embodiments thereof are shown by way of example in the drawings and will herein be described in detail. It should be understood, however, that there is no intent to limit exemplary embodiments of the inventive concept to the particular forms disclosed, but on the contrary, exemplary embodiments of the inventive concept are to cover all modifications, equivalents, and alternatives falling within the scope of the inventive concept.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of exemplary embodiments of the inventive concept. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of exemplary embodiments of the inventive concept. As used herein, the singular forms "a," "an" and "the" are intended to include the plural forms as well, unless the context clearly indicates otherwise.

In order to more completely describe exemplary embodiments of the inventive concept, various aspects will be described in detail with reference to the attached drawings. However, the inventive concept is not limited to exemplary embodiments of the inventive concept described. Like numbers refer to like elements throughout the description of the figures.

BRIEF DESCRIPTION OF THE DRAWINGS

Exemplary embodiments of the inventive concept are described in further detail below with reference to the accompanying drawings, in which.

DETAILED DESCRIPTION OF EXEMPLARY EMBODIMENTS

Figure 2:
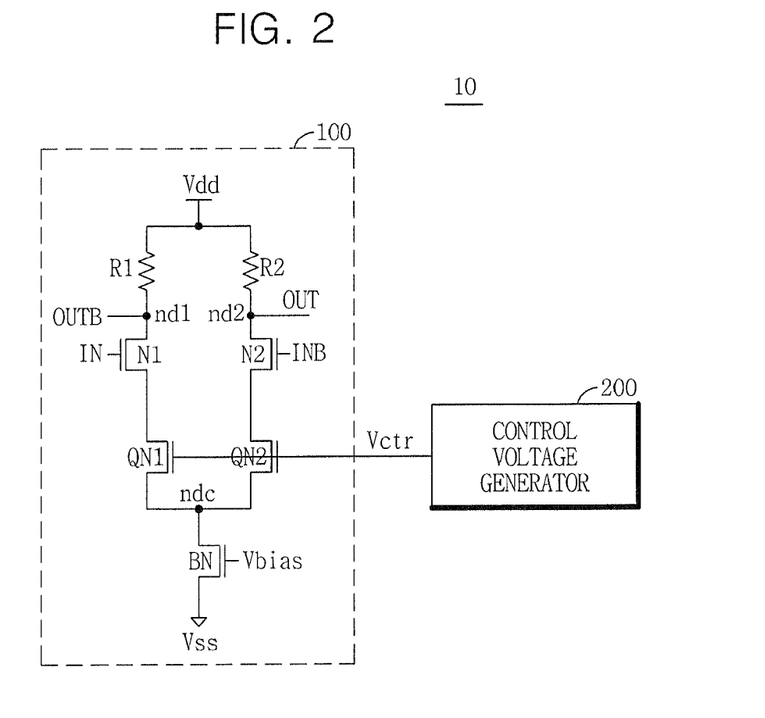
FIG. 2 is a circuit diagram of a high speed linear differential amplifier 10 according to an exemplary embodiment of the inventive concept.

FIG. 2 is a circuit diagram of a high speed linear differential amplifier 10 according to an exemplary embodiment of the inventive concept. The high speed linear differential amplifier 10 of FIG. 2 includes a differential amplifier 100 that receives an input signal IN and an inverted input signal INB, and that detects and amplifies the voltage difference between the input signal pair IN and INB, and outputs an output signal OUT and an inverted output signal OUTB. The high speed linear differential amplifier 10 of FIG. 2 further includes a control voltage generator 200 that outputs a control voltage Vctr for adjusting the gain of the differential amplifier 100.

The differential amplifier 100 may include first and second input units that are connected in parallel between a power supply voltage Vdd and a common node ndc and that receive the input signal pair IN and INB, and a driving unit that is connected between the common node ndc and a ground voltage Vss and activates the differential amplifier 100.

The first input unit includes a load resistor R1, an input transistor N1, and a control transistor QN1 serially connected between the power supply voltage Vdd and the common node ndc. The input transistor N1 receives the input signal IN at its gate, and the control transistor QN1 receives the control signal Vctr at its gate. The second input unit is connected in parallel with the first input unit and includes a load resistor R2, an input transistor N2, and a control transistor QN2 serially connected between the power supply voltage Vdd and the common node ndc. The input transistor N2 receives the inverted input signal INB at its gate, and the control transistor QN2 also receives the same control signal Vctr as received by the control transistor QN1 of the first input unit. The driving unit may include a driving transistor BN between the common node ndc and the ground voltage Vss receiving a bias voltage Vbias at its gate to activate the differential amplifier 100. The bias voltage Vbias for activating the differential amplifier 100 enables the driving transistor BN to operate in a saturation region.

The output signal pair OUT and OUTB of the differential amplifier 100 is output through first and second output nodes nd1 and nd2.

The control signal Vctr should have a swing width within the voltage level range in which the control transistors QN1 and QN2 can operate in a linear area. The control signal Vctr should have a voltage level that varies in a range in which drain-source voltages $V_{ds}$ of the control transistors QN1 and QN2 are smaller than a difference between a gate-source voltage $V_{gs}$ and a threshold voltage Vth. As a result, the control transistors QN1 and QN2 of the differential amplifier 100 of FIG. 2 operate in the linear area, and the control transistors QN1 and QN2 which operate in the linear area operate as variable resistors whose resistance is adjusted in response to the control voltage Vctr. The control transistors QN1 and QN2, which operate as variable resistors, operate as source degeneration elements to adjust the gain of the differential amplifier 100, thereby extending linearity. Since the control transistors QN1 and QN2 operate as the source degeneration elements, even though the control voltage Vctr applied to the control transistors QN1 and QN2 varies, maximum and minimum voltage levels of the output signal pair OUT and OUTB (which can be output by the differential amplifier 100) do not vary. Thus, when the maximum and minimum voltage levels of the input signal pair IN and INB are not restricted, a maximum swing width of the output signal pair OUT and OUTB is maintained regardless of the control voltage Vctr.

Figure 3:
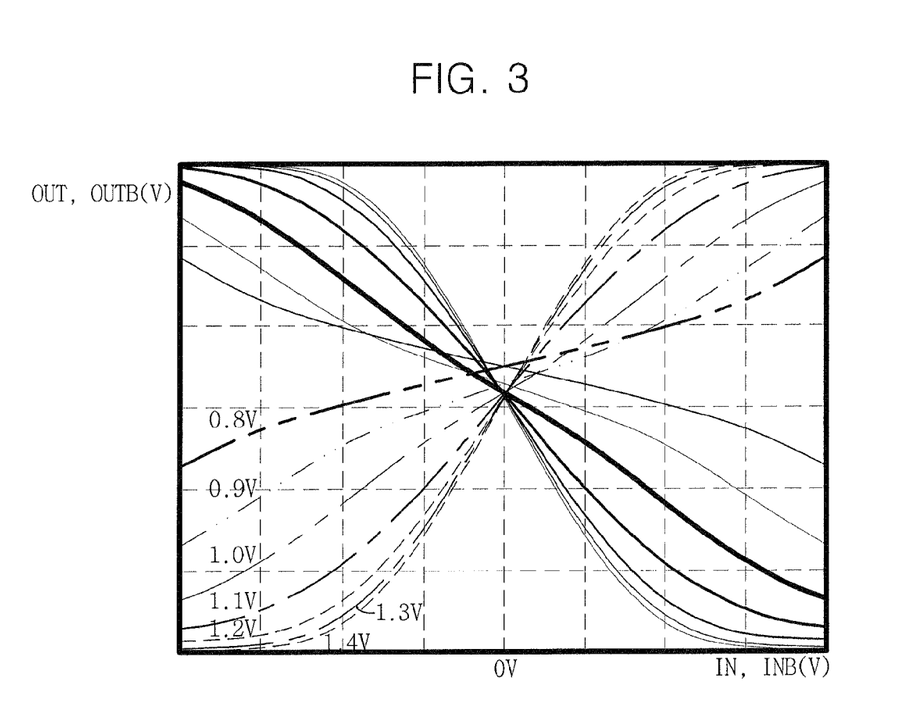
FIG. 3 is a simulation view illustrating a change of an output voltage with respect to a change in an input voltage of a differential amplifier according to a control voltage.

FIG. 3 is a simulation view illustrating a change of an output voltage with respect to an input voltage of a differential amplifier according to a variable control voltage.

When the voltage level of the control voltage Vctr varies, the control transistors QN1 and QN2 operate as the source degeneration elements to vary the gain of the differential amplifier 100. Referring to FIG. 3, when looking at a change of the output signal pair OUT and OUTB with respect to the input signal pair IN and INB while varying the voltage level of the control voltage Vctr (for example, from 0.8V to 1.4V), the level of the control voltage Vctr that maximizes the range within which the output signal pair OUT and OUTB of the differential amplifier 100 maintains linearity with respect to the input signal pair IN and INB is 1.0 V. When the control voltage Vctr is 0.8 V to 0.9 V, since the maximum and minimum voltage levels of the input signal pair IN and INB are restricted, the output voltage pair OUT and OUTB approximately maintains linearity, but the swing width is small. On the other hand, when the control voltage Vctr is 1.1 V to 1.4 V, the output voltage pair OUT and OUTB is not linearly output with respect to the input signal pair IN and INB. When the control voltage Vctr is 1.0 V, the output voltage pair OUT and OUTB is most linearly output with respect to the input signal pair IN and INB, and the swing width of the output signal pair OUT and OUTB is large.

The differential amplifier 100 receives the optimal control voltage Vctr at which the most linear output signal pair OUT and OUTB can be output through a simulation performed in the control voltage generator 200. However, even when the optimal control voltage Vctr is applied to the differential amplifier 100, it is difficult to cope with a gain change of the differential amplifier 100 that may occur due to a change in process, temperature, and swing width of the input signal. Thus, linearity of the output signal pair OUT and OUTB may not be maintained in the event of such a gain change.

For this reason, a characteristic of the output signal pair OUT and OUTB with respect to the input signal pair IN and INB in the case in which the voltage level of the control voltage Vctr is 1.0 V is compared to a characteristic of the output signal pair OUT and OUTB with respect to the input signal pair IN and INB in the case in which the voltage level of the control voltage Vctr is not 1.0 V. In a simulation result in the case in which the voltage level of the control voltage Vctr is 1.0 V, when the input signal pair IN and INB having half (½) the maximum and minimum input voltage levels the input signal pair IN and INB can have is applied to the differential amplifier 100, the output signal pair OUT and OUTB having half (½) the maximum and minimum output voltage levels. Voltages of a half (½) of the maximum and minimum output voltage levels means a voltage value of half (½) the maximum output voltage and a voltage value of half (½) the minimum output voltage has, with respect to the output voltage when there is no voltage difference between the input signal pair IN and INB (in FIG. 3, a case of IN=INB=0 V).

When the control voltage Vctr is 1.1 V, the swing width of the output signal pair OUT and OUTB is further increased, but compared to the case in which the control voltage Vctr is 1.0 V, linearity deteriorates.

Therefore, it can be understood from the simulation result of FIG. 3 that in order for the differential amplifier 100 to have a gain in which the output signal pair OUT and OUTB can linearly change with respect to a change of the input signal pair IN and NB, when the input signal pair IN and INB is applied with half (½) the maximum and minimum input voltage levels, the control voltage Vctr value that enables the output signal pair OUT and OUTB to have half (½) level of the maximum and minimum output voltages should be determined.

A change of the output signal pair OUT and OUTB with respect to a change of the input signal pair IN and INB may not be identical to the simulation result due to various conditions when the differential amplifier is applied to an actual circuit. In order to prepare for this case, if the resistance of a reference resistor can be adjusted by using a variable resistor as the reference resistor, it is possible to cope with various condition changes of an actual circuit.

Figure 4:
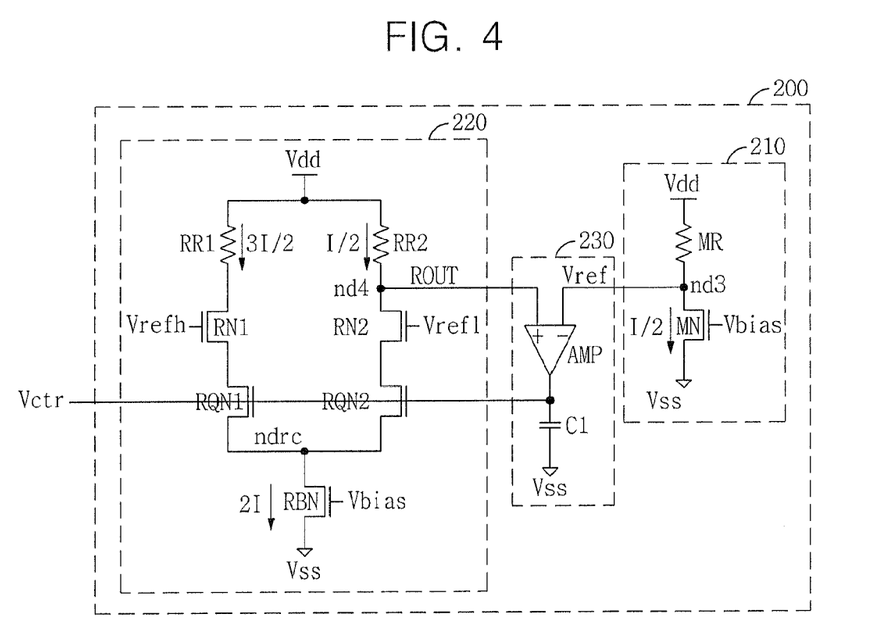
FIG. 4 is a circuit diagram of an exemplary implementation of the control voltage generator 200 in the high speed linear differential amplifier 10 of FIG. 2.

FIG. 4 is a circuit diagram of an exemplary implementation of the control voltage generator 200 in the high speed linear differential amplifier 10 FIG. 2.

The control voltage generator 200 includes a reference voltage generator 210 that generates a reference voltage Vref, a replica differential amplifier 220, and a comparison unit 230. The replica differential amplifier 220 has substantially the same size and configuration as the differential amplifier 100 except that an inverted output signal and an output node through which the inverted output signal is output are not shown in FIG. 4. The replica differential amplifier 220 receives a reference input signal Vrefh and an inverted reference input signal Vrefl having half (½) the level of maximum and minimum voltages of the input signals IN and INB and outputs a replica output signal ROUT. The comparison unit 230 compares the reference voltage Vref with the replica output signal ROUT and generates Vctr to control the gains of the differential amplifier 100 and of the replica differential amplifier 220.

The reference voltage generator 210 includes a reference resistor MR and a bias transistor MN that are serially connected between a power supply voltage Vdd and a ground voltage Vss. The reference resistor MR has the same resistance as each of the load resistors R1 and R2 of the differential amplifier 100. The bias transistor MN that receives a bias voltage Vbias through its gate is a transistor for generating the reference voltage Vref and has a channel width of one fourth (¼) the width of the channel of the driving transistor BN of the differential amplifier 100 but is otherwise the same as the driving transistor BN of the differential amplifier 100. Since the bias transistor MN has a channel width one fourth (¼) that of the driving transistor BN and since the channel width of a transistor proportional to its current driving ability, the bias transistor MN has a current driving ability of one fourth (¼) of the current driving ability of the driving transistors BN or RBN. The reference voltage Vref is output at a third node nd3 between the reference resistor MR and the bias transistor MN.

The replica differential amplifier 220 is a replica circuit which has substantially the same size and configuration as the differential amplifier 100 except that an inverted output signal and an output node through which the inverted output signal is output are not shown in FIG. 4 so that the control voltage generator 200 can generate the control voltage Vctr corresponding to a characteristic of the differential amplifier 100. The replica differential amplifier 220 includes first and second replica input units connected in parallel between the power supply voltage Vdd and a replica common node ndrc, and a replica driving unit connected between the replica common node ndrc and the ground voltage Vss.

The first replica input unit includes a replica load resistor RR1, a replica input transistor RN1 and a replica control transistor RQN1 which are serially connected between the power supply voltage Vdd and the replica common node ndrc. The replica input transistor RN1 receives a reference input signal Vrefh having half (½) the maximum voltage value of the input signal pair IN and INB at its gate, and the replica control transistor RQN1 receives the control signal Vctr at its gate. The second replica input unit is connected in parallel with the first replica input unit and includes a replica load resistor RR2, a replica input transistor RN2 and a replica control transistor RQN2 serially connected between the power supply voltage Vdd and the replica common node ndrc. The replica input transistor RN2 receives an inverted reference input signal Vrefl having half (½) the minimum voltage value of the input signal pair IN and INB at its gate, and the replica control transistor RQN2 receives the same control signal Vctr as the replica control transistor RQN1 of the first replica input unit. The replica driving unit includes a replica driving transistor RBN between the replica common node ndrc and the ground voltage Vss. The replica driving unit receives the same bias voltage Vbias at the gate of the replica driving transistor RBN as the driving transistor BN of the differential amplifier 100 and activates the replica differential amplifier 220. Since the reference input signal Vrefh and the inverted reference input signal Vrefl have half (½) the maximum and minimum voltages of the input signal IN and the inverted input signal INB, when the input signal IN and the inverted input signal INB have the swing width of +2 V to −2 V, the reference input signal Vrefh and the inverted reference input signal Vrefl have voltages of +1 V and −1 V, respectively. The maximum and minimum voltages of the input signal pair IN and INB are voltage values that are known in advance. Therefore, the voltage values of the reference input signal Vrefh and the inverted reference input signal Vrefl may be known in advance.

The comparison unit 230 includes a comparator AMP that receives the reference voltage Vref and the replica output voltage ROUT, compares the voltage values, and outputs the control voltage Vctr, and a capacitor C1 which filters the control voltage Vctr. The comparison unit 230 outputs the control voltage Vctr to the control transistors QN1 and QN2 of the differential amplifier 100 and to the control transistors RQN1 and RQN2 of the replica differential amplifier 220.

Figure 5:
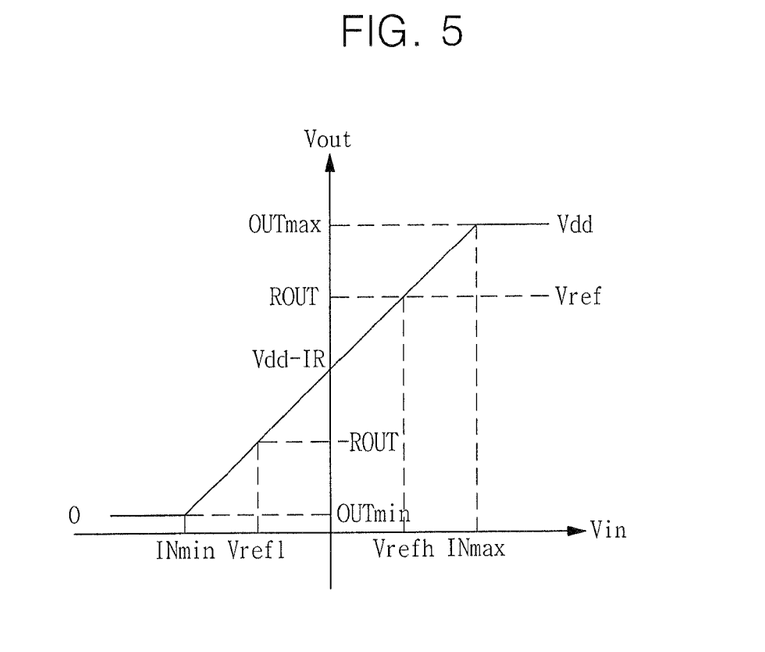
FIG. 5 is a graph illustrating a method of controlling the gain of a differential amplifier according to an exemplary embodiment through the control signal generator of FIG. 4.

FIG. 5 is a graph illustrating a method of controlling the gain of the differential amplifier 100 of FIG. 2 and the control signal generator 200 of FIG. 4.

The method illustrated in FIG. 5 will be described with reference to FIGS. 2 to 4. The reference voltage generator 210 generates the reference voltage Vref. Since the bias transistor MN of the reference voltage generator 210 has one fourth (¼) the current driving ability of the driving transistor BN and of the replica driving transistor RBN, if it is assumed that an electric current that flows through the driving transistor BN and the replica driving transistor RBN is 2*I, while the electric current that flows through the bias transistor MN is I/2. The reference resistor MR has the same resistance as the resistors R1 and R2 and as the replica resistors RR1 and RR2, and if it is assumed that this resistance is R, the reference voltage Vref applied to the third node nd3 has a voltage level of "Vdd−(I*R/2)".

The reference input signals Vrefh and Vrefl are applied to the gates of the replica input transistors RN1 and RN2, respectively. The reference input signals Vrefh and Vrefl have half (½) the maximum and minimum input voltages INmax and INmin of the input signals IN and NB. Since it is assumed that an electric current of 2I flows to the replica driving transistor RBN, ideally an electric current of 1/2*I flows through the second replica input unit and an electric current of 3/2*I flows through the first replica input unit. Since the replica output signal ROUT of the replica differential amplifier 220 is output through a fourth node nd4 between the replica resistor RR2 and the replica input transistor RN2 of the second replica input unit, when the reference input signals Vrefh and Vrefl are applied to the replica differential amplifier 220, an ideal replica output signal ROUT should have a voltage level of "Vdd−(I*R/2)". Thus, the ideal replica output signal ROUT should have the same level as the reference voltage Vref, and the voltage level of the replica output signal ROUT is a half (½) of the maximum output voltage with respect to the output voltage of the output signal pair OUT and OUTB in which there is no voltage difference between the input signal pair IN and INB. However, in actual practice, the replica output signal ROUT does not have the same voltage level as the reference voltage Vref in most cases.

The comparison unit 230 receives the replica output signal ROUT and the reference voltage Vref and outputs the control signal Vctr to the replica control transistors RQN1 and RQN2. Since the replica control transistors RQN1 and RQN2 are the source degeneration elements of the replica differential amplifier 220 like the control transistors QN1 and QN2, the gain and linearity of the replica differential amplifier 220 are varied by the control signal Vctr. Since a gain change of the replica differential amplifier 220 causes the voltage level of the replica output signal ROUT to vary, the replica differential amplifier 220 and the comparison unit 230 thus have a feedback configuration. Since the replica differential amplifier 220 and the comparison unit 230 have the feedback configuration, the replica output signal ROUT is finally stabilized at the same level as the reference voltage Vref, and the control voltage Vctr is also stabilized.

When the replica output signal ROUT of the replica differential amplifier 220 is stabilized at the same voltage level as the reference voltage Vref, the control voltage Vctr adjusts the gain of the replica differential amplifier 220 so that the replica differential amplifier 220 can output the replica output signal ROUT at half (½) level of the maximum output voltage in response to the reference input signals Vrefh and Vrefl having half (½) the maximum and minimum input voltages INmax and INmin. The differential amplifier 100 has the same configuration and characteristic as the replica differential amplifier 220. Therefore, the gain of the differential amplifier 100 that receives the control voltage Vctr through the gates of the control transistors QN1 and QN2 is adjusted equally to the gain of the replica differential amplifier 220.

The input transistors N1 and N2 of the first and second input units of the differential amplifier 100 receive the input signal IN and the inverted input signal INB, respectively, and the control transistors QN1 and QN2 of the first and second input units commonly receive the control voltage Vctr. The control voltage Vctr applied from the control voltage generator 200 is a voltage for adjusting the gain of the differential amplifier 100 and adjusts the gain so that the output signal pair OUT and OUTB of the differential amplifier 100 can linearly change over the whole range in which the input signal pair IN and INB can be changed. The differential amplifier 100 detects and amplifies the voltage difference between the input signal pair IN and INB applied to the first and second input transistors N1 and N2 but does not amplify the control voltage Vctr commonly applied to the first and second transistors QN1 and QN2 which are the source degeneration elements. Therefore, since the control transistors QN1 and QN2 of the first and second input units commonly receive the control voltage Vctr, the control voltage Vctr adjusts the gain and the linearity of the differential amplifier 100.

Since the gain of the differential amplifier 100 whose gain is controlled by the same control voltage Vctr is the same as the gain of the replica differential amplifier 220, when the input signal pair IN and INB are applied at the voltage level of the reference input signals Vrefh and Vrefl, the output signal OUT is output at the same level as the replica output signal ROUT. Thus, similarly to the replica differential amplifier 220, the differential amplifier 100 outputs the output signal OUT with a half (½) level of the maximum output voltage in response to the input signal pair IN and INB having half (½) the level of the maximum and minimum input voltages INmax and INmin. Compared to the simulation result of FIG. 3, since the differential amplifier 100 receives the control voltage Vctr of 1.0 V, a range in which the output signal pair OUT and OUTB maintains linearity with respect to the change of the input signal pair IN and INB is broad, and the gain is high.

It has been described above that the control voltage generator 200 receives the reference input signal pair Vrefh and Vrefl having half (½) the level of the maximum and minimum input voltages INmax and INmin, and the reference voltage Vref having half (½) the level of the maximum output voltage. These values are examples of a set of values consistent with the reference input signal pair Vrefh and Vrefl and the reference voltage Vref in the simulation result of FIG. 3. However, as illustrated in FIG. 3, when the control voltage Vctr in which the differential amplifier 100 can show the optimum linearity is determined in the simulation result, it is possible to know the input signal pair IN and INB and the output signal pair OUT and OUTB of the differential amplifier 100 according to the determined control voltage Vctr. Therefore, it is possible to set the voltage level of the reference input signal pair Vrefh and Vrefl of the replica differential amplifier 220 as that of the input signal pair IN and IB at a certain point and design the reference voltage generator 210 so that the voltage level of the output signal OUT at this time can be set to the reference voltage Vref. Thus, as a further example, the replica differential amplifier 220 can receive the reference input signal pair Vrefh and Vrefl with one fourth (¼) level of the maximum and minimum input voltages INmax and INmin, and the reference voltage generator 210 can generate the reference voltage Vref corresponding to the reference input signal pair Vrefh and Vrefl with reference to the simulation result of FIG. 3. Even in this case, since the control voltage Vctr is adjusted so that the replica output signal ROUT of the replica differential amplifier 220 can have the same voltage level as the reference voltage Vref, the control voltage Vctr which can show the optimum linearity shown in the simulation result is generated. Thus, when the simulation result is shown as in FIG. 3, the control voltage Vctr is adjusted to 1.0 V.

Further, it has been described above that the channel width of the bias transistor MN is one fourth (¼) of the driving transistor BN so that the reference voltage Vref can have one half (½) the level of the maximum output voltage, and the resistance of the reference resistor MR is the same as the resistance of the load resistors R1 and R2. However, if the reference input signal pair Vrefh and Vrefl applied to the replica differential amplifier 220 have a voltage level other than one half (½) level of the maximum and minimum input voltages INmax and INmin, the level of the reference voltage Vref should be adjusted to correspond thereto. The channel width of the bias transistor MN and the resistance of the reference resistor MR may be variously adjusted to adjust the level of the reference voltage Vref. If the reference input signal pair Vrefh and Vrefl have one fourth (¼) level of the maximum and minimum input voltages INmax and INmin, the channel width of the bias transistor MN may be adjusted to be three eighths (⅜) of the channel width of the driving transistor BN, and the resistance of the reference resistor MR may be adjusted so that the reference voltage Vref can be matched with the simulation result for the input reference input signal pair Vrefh and Vrefl.

A change of the output signal pair OUT and OUTB with respect to a change of the input signal pair IN and INB may not be identical to the simulation result due to various conditions when the differential amplifier is applied to an actual circuit. The voltage level of the reference input signal pair Vrefh and Vrefl may be precisely adjusted to cope with the condition change.

Figure 6:
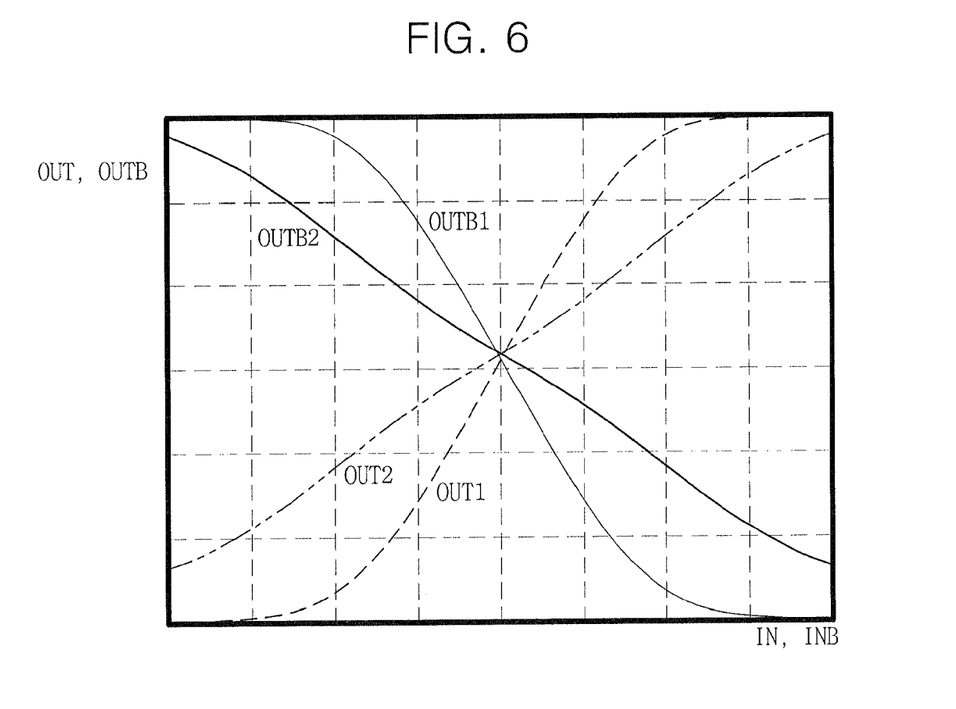
FIG. 6 is a graph of a simulation illustrating an output signal change of a high speed linear differential amplifier 10 of FIG. 2.

FIG. 6 is a graph of a simulation illustrating an output signal change of a high speed linear differential amplifier 10 of FIG. 2.

In FIG. 6, a first output signal pair OUT1 and OUTB1 represents signals output (in response to a change of the input signal pair IN and INB) from the conventional differential amplifier that does not receive the control signal Vctr. A second output signal pair OUT2 and OUTB2 represents output signals output from the differential amplifier 100 whose gain is adjusted in response to the control signal Vctr applied from the control voltage generator 200 according to an exemplary embodiment. As described above, the differential amplifier according to an exemplary embodiment generates the control voltage Vctr to output the output signal OUT having one half (½) the level of the maximum output voltage in response to the input signal pair IN and INB having one half (½) the level of the maximum and minimum input voltages INmax and INmin. As the differential amplifier 100 outputs the output signal pair OUT2 and OUTB2 in response to the control voltage Vctr, the output signal pair OUT2 and OUTB2 is linearly varied in the whole range in which the input signal pair IN and INB changes. Since the control voltage generator 200 includes the replica differential amplifier 200 and generates the control voltage Vctr by using the replica output signal ROUT of the replica differential amplifier 220, which is subject to the same temperature, and made by the same process, the output signal pair OUT2 and OUTB2 is linearly output regardless of a change in temperature, process, or swing width of the input signals IN and INB.

It has been described above that the input signal pair IN and INB are signals that are inverted relative to each other, but since the differential amplifier is a circuit that detects and amplifies the voltage difference of any two input signals, the input signal pair IN and INB may not be signals that are inverted relative to each other. Thus, a first input signal and a second input signal may be applied to the gates of the input transistors N1 and N2 as the input signal pair.

Figure 7:
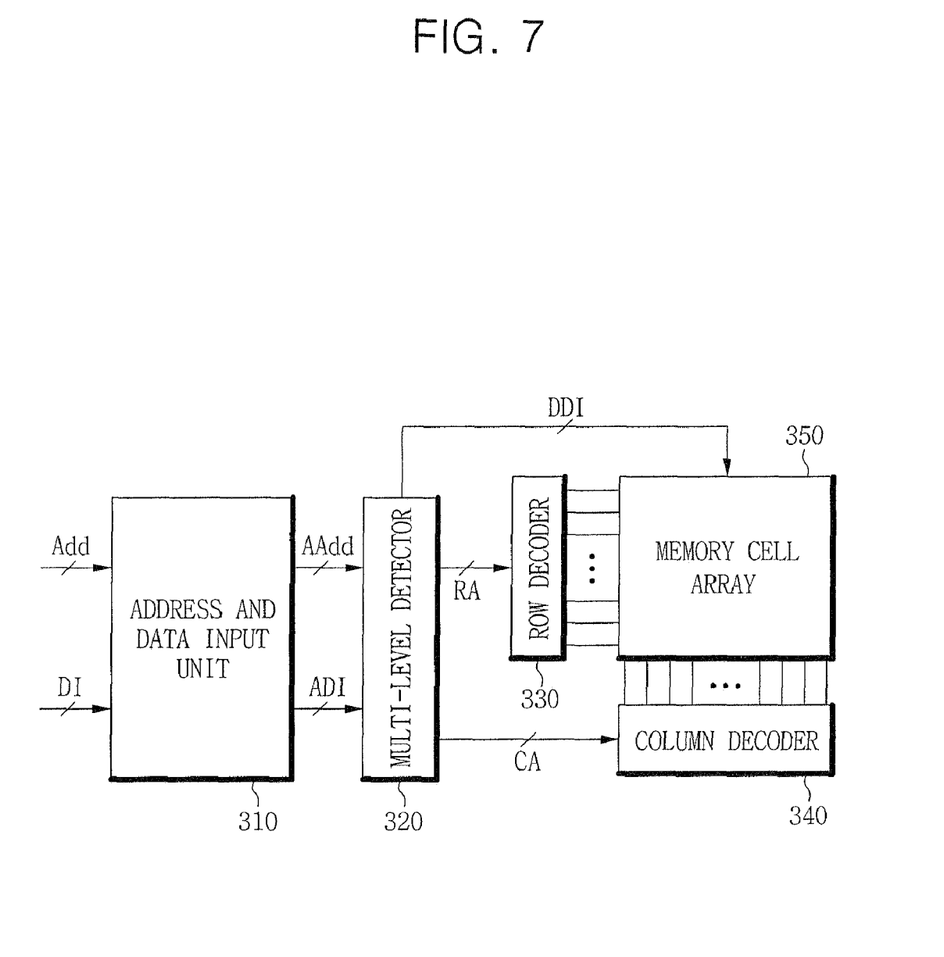
FIG. 7 is a block diagram of a semiconductor memory device including the high speed linear differential amplifier 10 of FIG. 2.

FIG. 7 is a block diagram of a semiconductor memory device including the high speed linear differential amplifier 10 of FIG. 2.

The semiconductor memory device of FIG. 7 includes an address and data input unit 310, a multi-level detector 320, a row decoder 330, a column decoder 340, and a memory cell array 350.

The address and data input unit 310 includes at least one high speed linear differential amplifier 10, and linearly amplifies a received address signal Add and a received data signal DI received from the outside and outputs an amplified address signal AAdd and an amplified data signal ADI to the multi-level detector 320. The address signal Add, the data signal DI, the amplified address signal AAdd, and the amplified data signal ADI may respectively correspond to the input signal IN, the inverted input signal INB, the output signal OUT, and the inverted output signal OUTB as shown in FIG. 2. The address signal Add, the data signal DI, the amplified address signal AAdd, and the amplified data signal ADI are multi-level digital signals (or analog signals) that are not binary digital signals having only a high level and a low level. The multi-level detector 320 detects voltage levels of the amplified address signal AAdd and the amplified data signal ADI, generates a row address RA, a column address CA, and input data DDI that correspond to the detected voltage levels, and outputs the row address RA, the column address CA, and the input data DDI to the row decoder 330, the column decoder 340, and the memory cell array 350, respectively. The row address RA, the column address CA, and the input data DDI output from the multi-level detector 320 are binary digital signals having only high level and a low level that are different from the address signal Add and the data signal DI. Since the amplified address signal AAdd and the amplified data signal ADI are multi-level digital signals as described above, the multi-level detector 320 can generate a plural-bit row address RA, a plural-bit column address CA, and plural-bit input data DDI each time the amplified address signal AAdd or the amplified data signal ADI is applied.

The memory cell array 350 includes a plurality of memory cells located at the intersections of a plurality of word lines and a plurality of bit lines. The row decoder 330 activates the word line corresponding to the row address RA among the word lines of the memory cell array 350. The column decoder 340 selects the bit line corresponding to the column address CA. At the time of a write operation of the semiconductor memory device, the multi-level detector 320 receives the amplified input data ADI and outputs the input data DDI to the memory cell array 350, and the memory cell array 350 stores data in a memory cell selected by the activated word line and the selected bit line.

Since the semiconductor memory device of FIG. 7 can receive the address signal Add and the data signal DI with multiple levels, each time when the address signal Add and the data signal DI are applied, multiple bits of information as when an address and data of two or more binary bits are transmitted. Therefore, since the address and data can be applied at a high speed, the semiconductor memory device can operate at a high speed. Also, since the address and the data of plural bits can be applied through one input line, the number of input lines of the semiconductor memory device can be reduced.

In the semiconductor memory device, the address and data should commonly be transmitted at a high speed, but since a command is transmitted at a speed slower than the address or the data, the address and the data are applied at multiple levels. However, the command may be also applied at multiple levels.

A semiconductor memory device which receives or outputs the command, the address, and data in units of packets may be configured to receive the packet at multiple levels so that a high speed operation can be performed.

As described above, in a high speed linear differential amplifier according to an exemplary embodiment, a control signal generator configured to control a differential amplifier receives a reference input signal and an inverted input signal and outputs a replica output signal, sets a voltage of an output signal at which linearity of an output signal of the differential amplifier corresponding to the reference input signal and the inverted reference input signal according to a voltage level change of a control signal is maximum as a reference voltage, generates a control voltage which makes a voltage level of the replica output signal identical to the reference voltage, and outputs the control voltage to the differential amplifier. The gain and linearity of the differential amplifier is varied by the control signal. Therefore, the high speed linear differential amplifier according to an exemplary embodiment can output the output signal which linearly changes in a broad range with respect to a change of the input signal regardless of a change in temperature, process, or swing width of the input signal.

The foregoing is illustrative of exemplary embodiments of the inventive concept and is not to be construed as limiting thereof. Although a few exemplary embodiments of the inventive concept have been described, those skilled in the art will readily appreciate that many modifications are possible in exemplary embodiments of the inventive concept without materially departing from the novel teachings and advantages. Accordingly, all such modifications are intended to be included within the scope of this inventive concept as defined in the claims. Therefore, it is to be understood that the foregoing is illustrative of various exemplary embodiments of the inventive concept and is not to be construed as limited to the specific embodiments disclosed, and that modifications to the disclosed embodiments, as well as other embodiments, are intended to be included within the scope of the appended claims.

What is claimed is:

1. A high speed linear differential amplifier, comprising:
    a differential amplifier configured to amplify a voltage difference between a first input signal and a second input signal and to generate an output signal and;
    a control signal generator that includes a replica differential amplifier and configured to generate a control signal that controls a gain of the differential amplifier and of the replica differential amplifier, wherein the differential amplifier comprises:
    a first input unit connected between a first power supply voltage and a common node, and configured to receive the control signal and the first input signal and to output an inverted first input signal to a first output node;
    a second input unit connected between the first power supply voltage and the common node in parallel with the first input unit, and configured to receive the control signal and the second input signal and to output an inverted second input signal to a second output node; and
    a driving unit including a driving transistor connected between the common node and a second power supply voltage, and configured to activate the differential amplifier in response to a bias voltage applied to a gate of the driving transistor.

2. The high speed linear differential amplifier of claim 1, wherein the first input unit comprises:
    a first load resistor, a first input transistor and a first control transistor connected in series between the first power supply voltage and the common node, wherein the first input transistor is configured to receive the first input signal at its gate, and the first control transistor is configured to receive the control signal at its gate.

3. The high speed linear differential amplifier of claim 2, wherein the second input unit comprises:
    a second load resistor connected between the first power supply voltage and the second output node;
    a second input transistor and a second control transistor connected in series between the second output node and the common node, wherein the second input transistor is configured to receive the second input signal at its gate, and the first control transistor is configured to receive the control signal at its gate.

4. A semiconductor memory device comprising the high speed differential amplifier of claim 2.

5. The semiconductor memory device of claim 4, further comprising: an address-and-data-input unit, a multi-level detector, a row decoder, a column decoder, and a memory cell array,
    wherein the address-and-data-input unit includes the high speed linear differential amplifier and linearly amplifies multi-level digital signals including a received address signal and a received data signal and outputs multi-level digital signals including an amplified address signal and an amplified data signal to the multi-level detector; and
    wherein the multi-level detector outputs a row address RA, a column address CA, and an input data output as binary digital signals having only a high level and a low level.

6. A high speed linear differential amplifier comprising:
    a differential amplifier configured to amplify a voltage difference between a first input signal and a second input signal and to generate an output signal; and
    a control signal generator that includes a replica differential amplifier being a replica of the differential amplifier and configured to generate a control signal that controls a gain of the differential amplifier and of the replica differential amplifier, wherein the replica differential amplifier configured to receive a first reference input signal and a second reference input signal, and to amplify a voltage difference between the first reference input signal and the second reference input signal to generate a replica output signal,
    wherein the control signal generator generates the control signal by comparing the replica output signal with a reference voltage.

7. The high speed linear differential amplifier of claim 6, wherein each of the first reference input signal and the second reference input signal has a voltage level within a range of the first input signal and the second input signal, and
    the reference voltage is a voltage of the output signal corresponding to a voltage level of the control signal that maximizes the linearity of the output signal of the differential amplifier with respect to the first input signal and the second input signal.

8. The high speed linear differential amplifier of claim 6, wherein the control signal generator comprises:
    a reference voltage generator configured to generate the reference voltage;
    the replica differential amplifier having a same configuration as the differential amplifier, and configured to receive the control signal, the first reference input signal, and the second reference input signal and to generate the replica output signal; and
    a comparison unit configured to compare the reference voltage with the replica output signal, and to adjust and output the control signal so that the replica output signal has a same voltage level as the reference voltage.

9. The high speed linear differential amplifier of claim 8, wherein the reference voltage generator comprises:
a reference resistor connected between the first power supply voltage and a third output node; and
a bias transistor connected between the third output node and the second power supply voltage, and configured to receive the bias voltage at its gate.

10. The high speed linear differential amplifier of claim 9, wherein a channel width of the bias transistor is designed to be one fourth (¼) the channel width of the driving transistor.

11. The high speed linear differential amplifier of claim 8, wherein the reference resistor is a variable resistor.

12. The high speed linear differential amplifier of claim 6, wherein the replica differential amplifier comprises:
a first replica input unit including a first replica resistor, a first replica input transistor, and a first replica control transistor that are connected in series between the first power supply voltage and a replica common node, and configured to receive the first reference input signal at a gate of the first replica input transistor and to receive the control signal at a gate of the first replica control transistor;
a second replica input unit, connected in parallel with the first replica input unit, including a second replica resistor, a second replica input transistor, and a second replica control transistor that are connected in series between the first power supply voltage and the replica common node, and configured to receive the second reference input signal at a gate of the second replica input transistor and to receive the control signal at the gate of a second replica control transistor, wherein the replica output voltage is at a fourth node between the second replica resistor and the second replica input transistor; and
a replica driving unit including a replica driving transistor connected between the replica common node and the second power supply voltage, and configured to activate the replica differential amplifier in response to the bias voltage applied to a gate of the replica driving transistor.

13. The high speed linear differential amplifier of claim 12, wherein the comparison unit comprises a comparator configured to compare the reference voltage with the replica output voltage and to output the control signal.

* * * * *